United States Patent [19]

Corkum et al.

[11] Patent Number: 5,459,604
[45] Date of Patent: Oct. 17, 1995

[54] COHERENT SWITCH OF CURRENTS IN SEMICONDUCTORS

[75] Inventors: Paul B. Corkum, Gloucester; H. C. Liu, Orleans, both of Canada

[73] Assignee: National Research Council of Canada, Ottawa, Canada

[21] Appl. No.: 279,114

[22] Filed: Jul. 22, 1994

[51] Int. Cl.⁶ .............. G02F 1/29; G02F 1/01; H01L 31/12; H01S 3/10
[52] U.S. Cl. .............. 359/248; 257/24; 257/27; 257/184; 257/192; 359/298; 359/338; 359/344; 372/26; 372/29; 372/74; 372/75
[58] Field of Search .............. 257/1, 2, 4, 27, 257/184, 192, 431, 428; 359/248, 298, 338, 344; 372/26, 29, 43, 46, 74, 75

[56] References Cited

U.S. PATENT DOCUMENTS

| | | | |
|---|---|---|---|
| 5,034,903 | 7/1991 | Alfano et al. | 250/311 |
| 5,148,242 | 9/1992 | Tsukada et al. | 359/248 |
| 5,157,467 | 10/1992 | Fujii | 257/24 |
| 5,321,714 | 6/1994 | Paoli | 372/43 |

FOREIGN PATENT DOCUMENTS

| 58-174924 | 10/1983 | Japan | 359/298 |
|---|---|---|---|

*Primary Examiner*—Mahshid D. Saadat
*Attorney, Agent, or Firm*—Neil Teitelbaum

[57] ABSTRACT

A method and apparatus is provided for propagating photoelectrons in a semiconductor material and for controlling the direction of photoelectrons produced in a semiconductor material. A selected region of the semiconductor material is irradiated with two beams of light that overlap in space and time. The two interfering light beams have a predetermined phase relationship and are harmonically related such that the frequency of one is approximately a multiple of two of the other. Each of the beams of light produce substantially a same number of photoelectrons in the semiconductor material. As the phase relationship between the two beams is varied, the direction of propagation of the photoelectrons produced, varies.

5 Claims, 7 Drawing Sheets

5,459,604

COHERENT SWITCH OF CURRENTS IN SEMICONDUCTORS

FIELD OF THE INVENTION

This invention relates to a method and apparatus for propagating photoelectrons in a semiconductor material. More particularly, the invention relates to controlling the direction of photoelectrons produced in a semiconductor material.

BACKGROUND OF THE INVENTION

For some time, there has been an interest in devices and methods for quantum interference. In U.S. Pat. No. 5,157,467 in the name of Fujii two prior art quantum devices are shown in FIGS. 1 and 2 and are described with reference to these figures.

The device of FIG. 1 operates in the following fashion. An electron wave injected by an electrode 10 is propagated through a part (left end part in FIG. 1) in which the distance between two electron waveguides 11 and 12 is made short enough to couple the electron wave, and arrives at decoupling part 15 or wave branching part. In this decoupling part indicated by dotted loop lines on the left side in FIG. 1, the distance between two electron waveguides 11 and 12 is made longer than that in the coupling part at the left end part, so that the electron wave divides into two waves in this decoupling part. In the coupling part 16 Si is doped so that the Fermi level in the two electron wave waveguides 11 and 12 may be located between first and second quantum levels or subbands. Thus, the electron wave is concentrated solely into the first level below the Fermi level, leading to the coupling of the electron waves. Practically, the coupling and decoupling are achieved by varying the thickness of an ALAS layer which is a barrier layer 13. That is, the barrier 13 is thinner at the two ends so that there is considerable tunneling between the waveguides or wells 11 and 12 at the ends but hardly any tunneling in the central region.

In the decoupling part 15, the phase difference between the two electron waves is due to the AB effect (more in detail, magnetostatic AB effect) by applying thereto the magnetic field in a direction normal to the coupling part 16 on the right side in FIG. 1 indicated by dotted looplines, and thus there is generated a bonding state having a lower energy or antibinding state having a higher energy. Here the Fermi level is adjusted by doping, so that only the electron wave having lower energy reaches a drain 14. That is, an effect similar to the optical interference effect occurs between the two coupling electron waves, and there are cases where electrons can reach the electrode 14 at the detection side and where electrons do not reach the electrode. As a result, on/off control of the device is performed.

Further there has also been proposed a device such as shown in FIG. 2 of U.S. Pat. No. 5,157,467 that utilizes real space transfer without using the tunneling phenomenon. The device of FIG. 2 does not utilize the electron wave, but such a device can readily be modified to take the electron wave out the quantum structure by replacing the layer 20 through which current flows with a quantum well or the like. The idea for this device is based on the energy discontinuity at a heterojunction region.

In an attempt to overcome disadvantages with these two prior art devices, U.S. Pat. No. 5,157,467 discloses a device that overcomes the problem of reflected electron waves as well as the problem of dispersion of wave numbers in conducted electrons. Fujii's device includes a source, a drain and waveguides with quantum structures between the source and the drain. An electron wave from the source that is confined in the waveguides is split into plural electrons waves. The phase difference between the split electron waves is controlled and the split electron waves are combined into a single electron wave. The combined electron wave is directed to the drain or out of the waveguides according to an energy state of the combined electron wave by a real space transfer such as a tunneling effect. The phase difference control is achieved by varying one of an electric field, a magnetic field or light.

Although all of these prior an devices appear to perform their intended functions, some better than others, all of these devices require leads attached to them for generating electron waves. As well, all of these devices utilize physical structures within the device to direct and combine electron waves.

It is an object of this invention, to provide a method and an apparatus for generating and controlling the direction of photoelectrons by varying the phase relationship between input optical signals.

It is an object of the invention to provide an apparatus of controlling a direction of phototelectrons in a semiconductor material, wherein the semiconductor has no input leads.

STATEMENT OF THE INVENTION

In accordance with the invention, there is provided, a method of a propagating phototelectrons in a semiconductor material in a predetermined direction, comprising the step of: irradiating a selected region of the semiconductor material with two beams that overlap in space and time, the two beams having a predetermined phase relationship and being harmonically related such that the frequency of one is approximately a multiple of two of the other, and wherein each of the beams of light produce substantially a same number of photoelectrons in the semiconductor material.

In accordance with the invention, a method is provided for controlling a direction of phototelectrons in a semiconductor material. The method comprises the steps of:

a) providing two harmonically related beams of light that overlap and space and time, each of the beams having a predetermined frequency;

b) adjusting the phase of the two beams of light so that the beams are in a predetermined phase relationship; and, c) irradiating a selected region of the semiconductor material with the two beams of light, the harmonic relationship between the beams of light being approximately a multiple of two, each of the beams having an amplitude that will producing substantially the same number of photoelectrons in the material.

In accordance with another aspect of the invention, an apparatus is provided for controlling a direction of phototelectrons in a semiconductor material. The apparatus comprises means for providing two beams of light to propagate toward the semiconductor material, the beams being of an amplitude such that they produce substantially the same number of photoelectrons within the semiconductor material, the beams of light being related in frequency such that the frequency of one is approximately a multiple of two of the other; and means for varying the phase relationship between the two beams of light so that the beams are in a predetermined phase relationship when they enter the semiconductor material.

Figure 1:
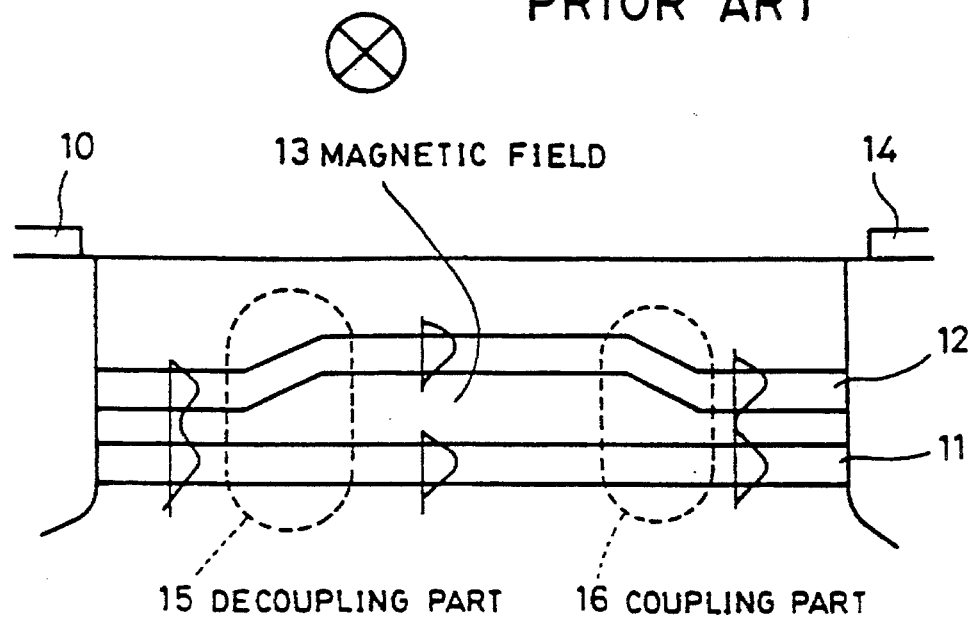
FIG. 1 is a sectional view of a first prior art quantum interference device; and, FIG. 2 is a view of a second prior art device utilizing carrier transfer in a k-space.
Figure 2:
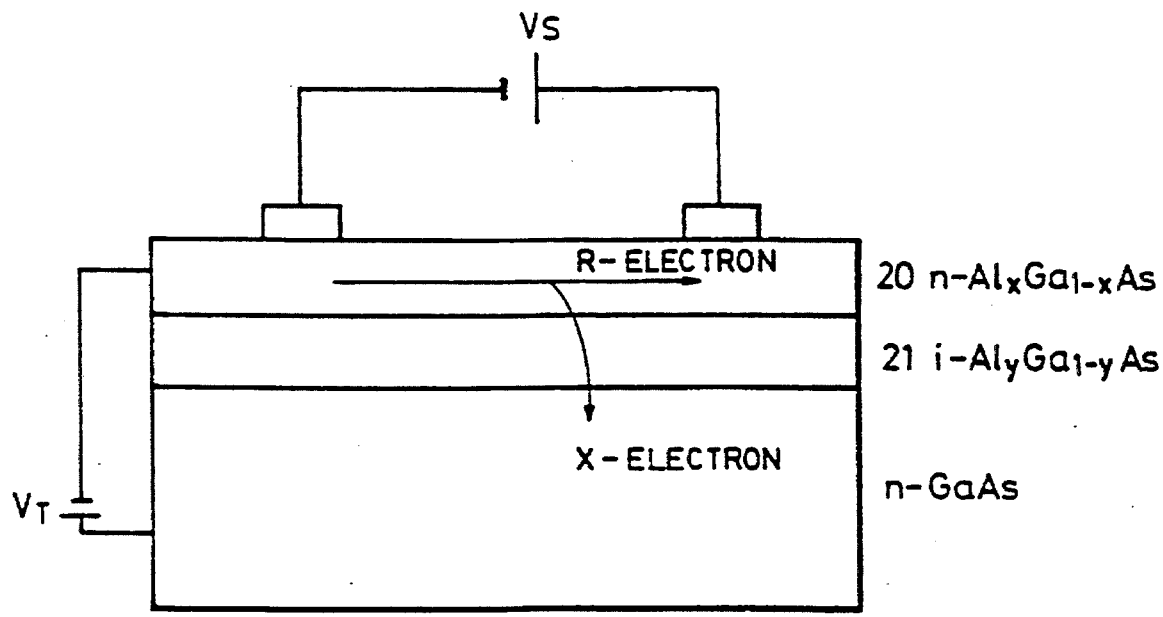
Figure 3:
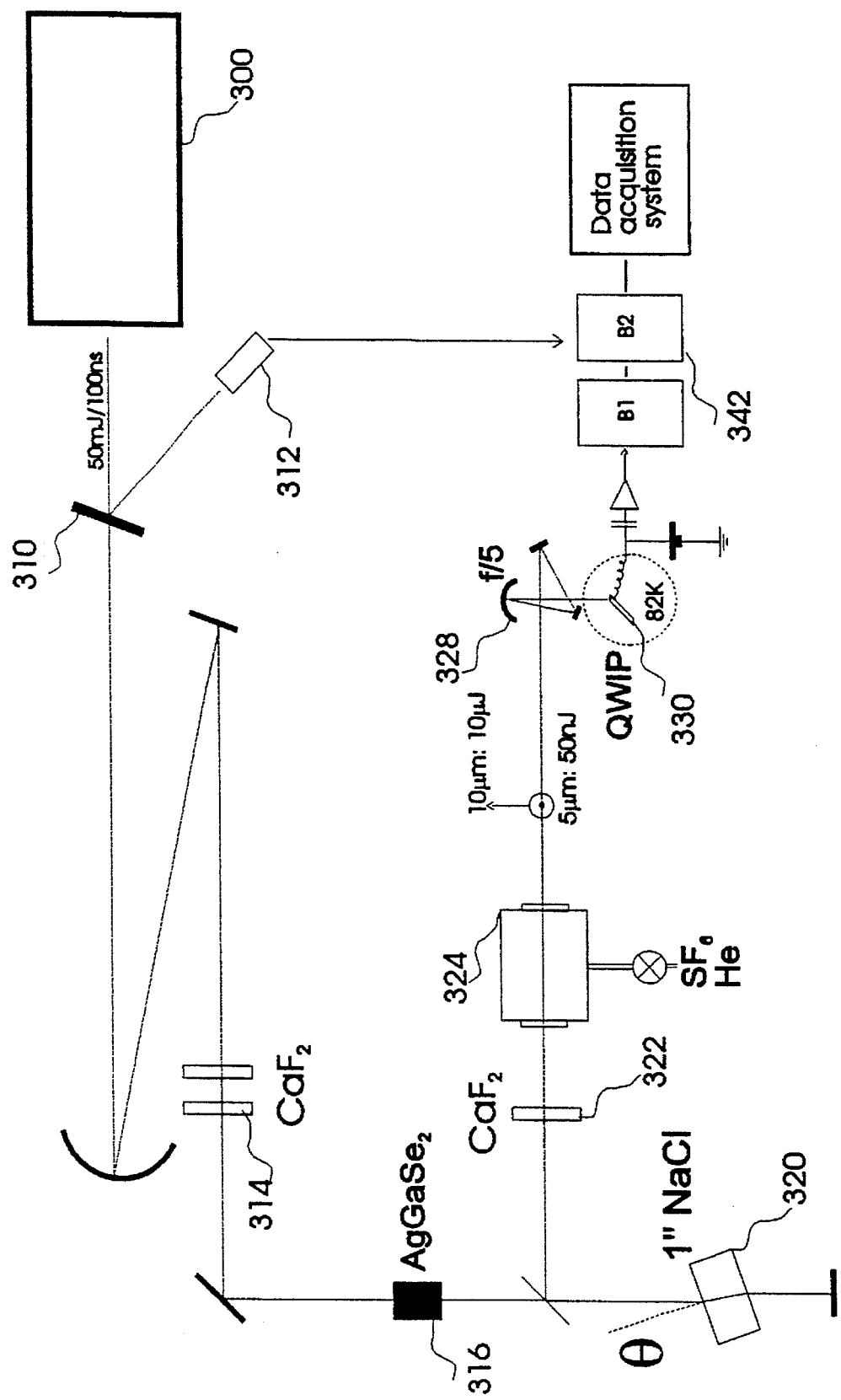
Figure 4:
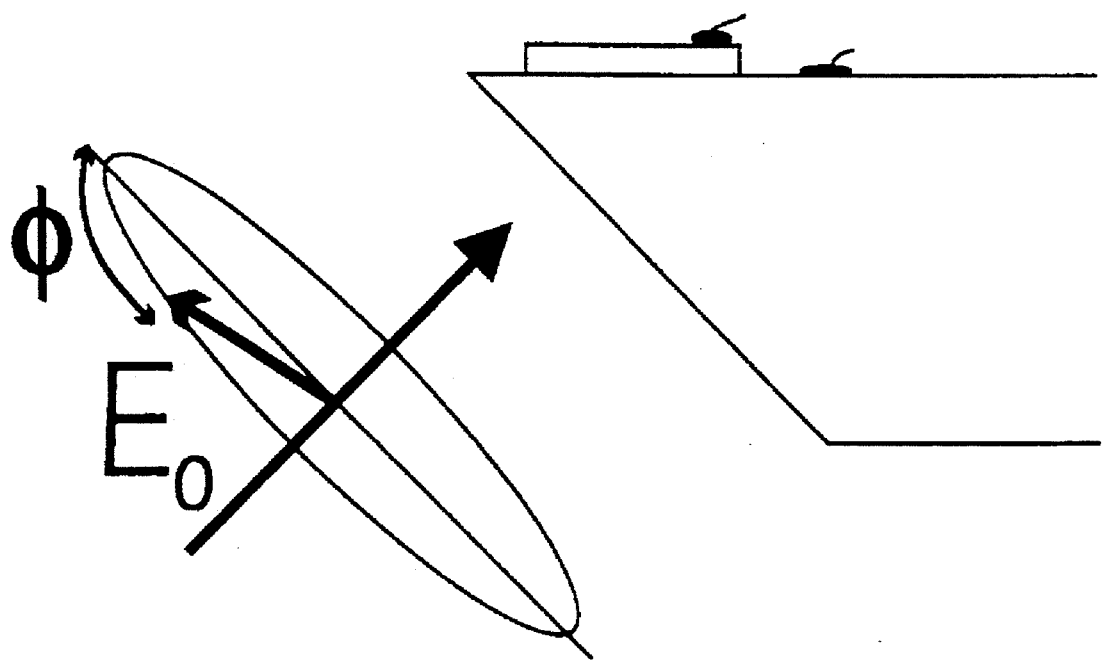
Figure 5:
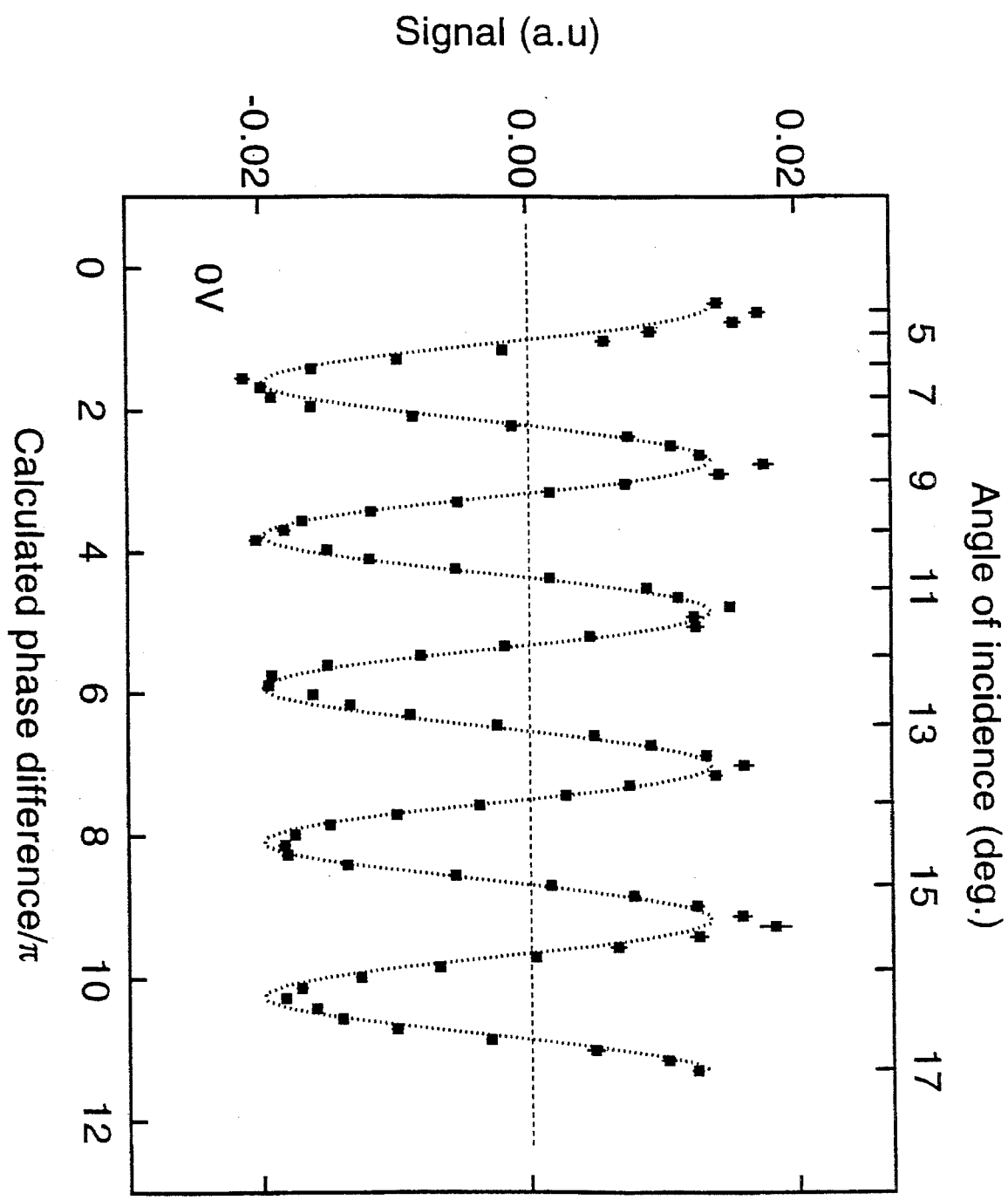
Figure 6:
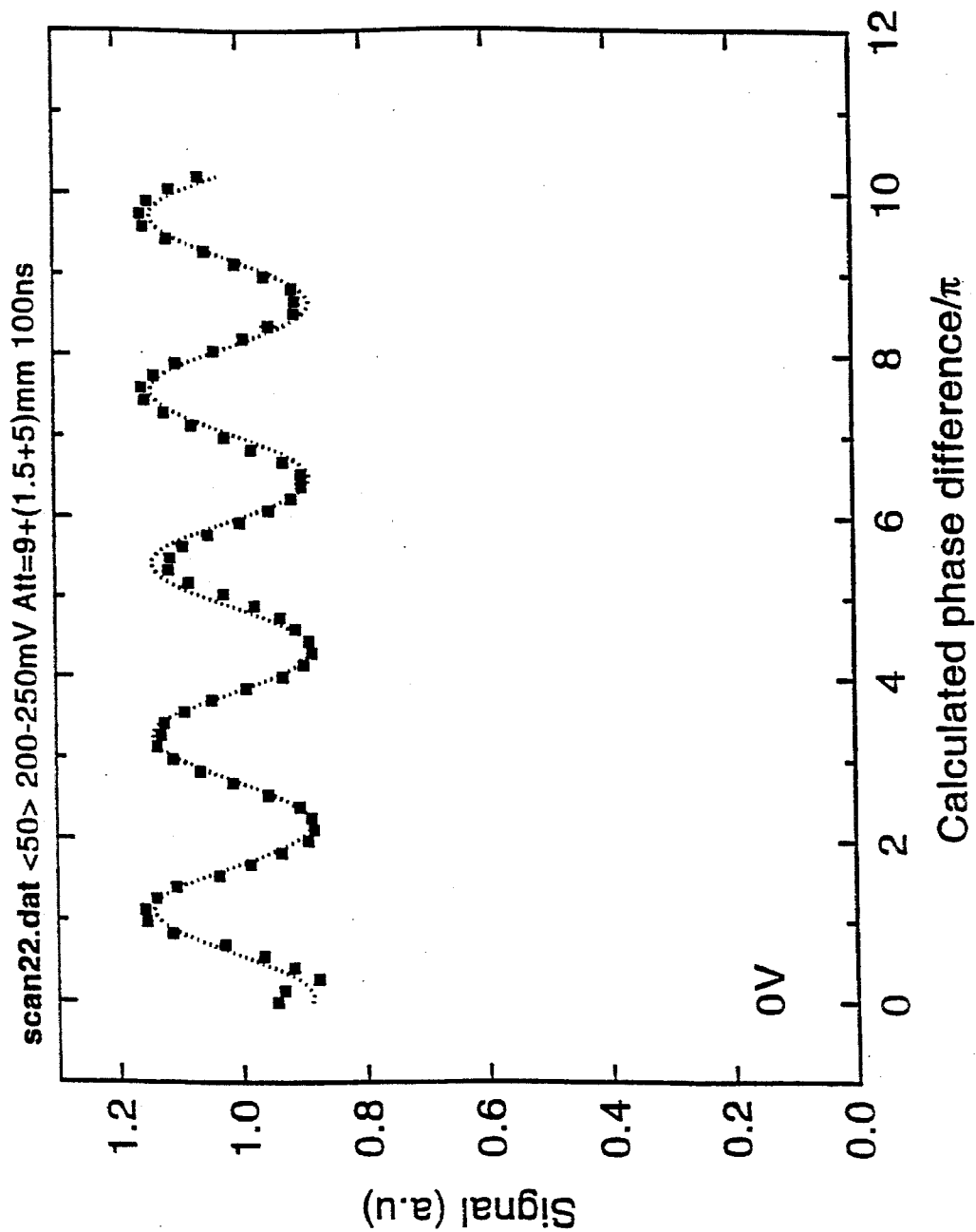
Figure 7:
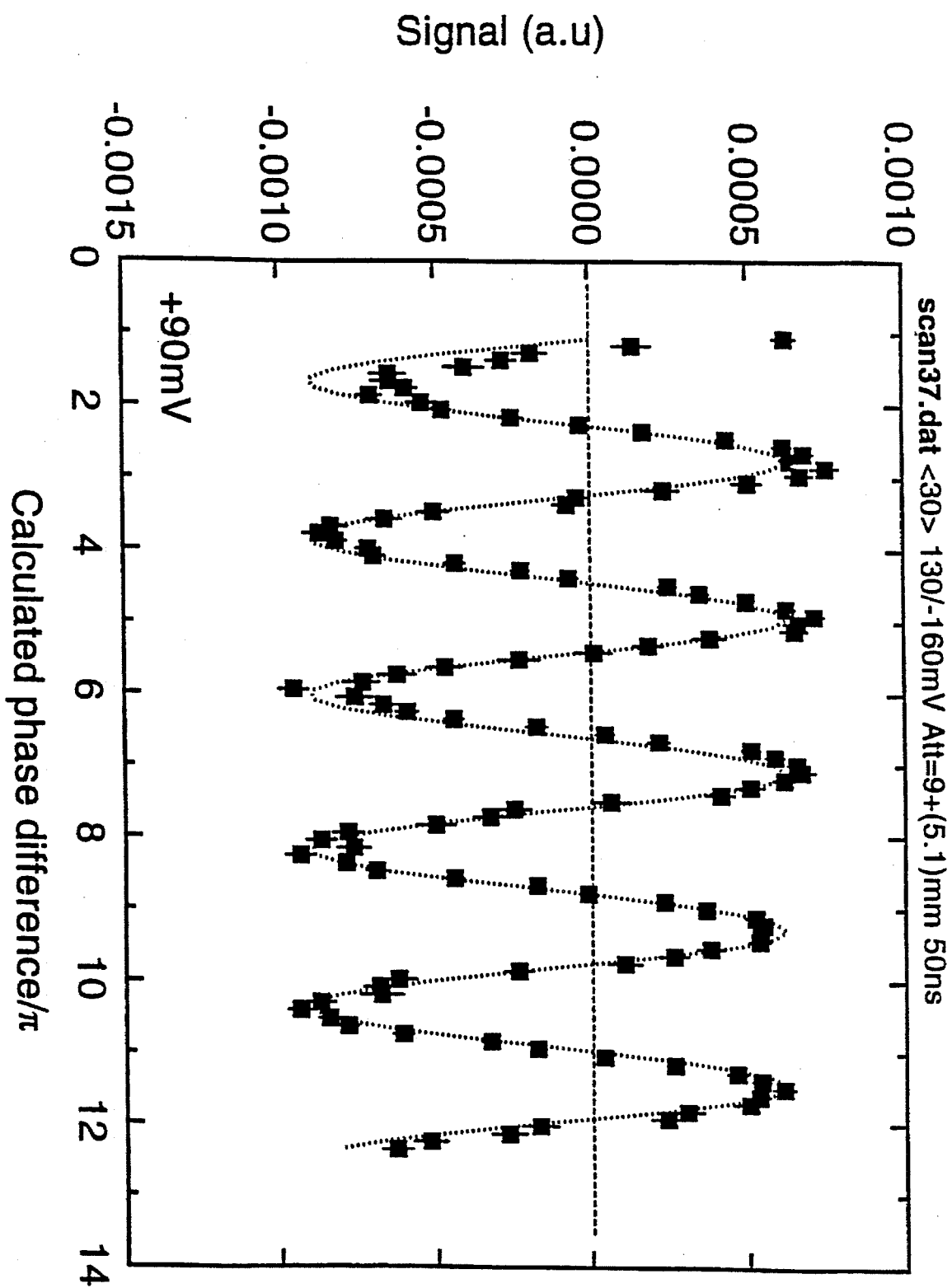

Exemplary embodiments of the invention will be described in conjunction with the following drawings, in which:

FIG. 3 is a block diagram of an experimental setup of quantum well device being irradiated indirectly by a laser source;

FIG. 4 is an enlarged view of the sample shown in FIG. 3, being irradiated;

FIG. 5 is a graph of phase difference versus signal magnitude in one of two directions, illustrating control over the current in a semiconductor sample having no internal fields, when illuminated by a 10.6 micron and the 5.3 micron light simultaneously;

FIG. 6 is a graph of phase difference versus signal magnitude illustrating a photovoltaic response in a sample with internal fields, showing a net current one direction;

FIG. 7 is a graph of phase difference versus signal magnitude illustrating a photovoltaic response in a sample with internal fields, showing cancellation of the photovoltaic response by controlling the current using external biasing in accordance with this invention; and, FIGS. 8a to 8d diagrams illustrating the physical principle of coherent control of photocurrent in quantum well structures.

DETAILED DESCRIPTION

In general if a material is irradiated with a light source (photons), electrons will be produced if the photons are of a high enough energy; by probabilities, the electron wave produced will be directed in one of two normal directions, perpendicular to the light source, and in the direction of the field.

In accordance with this invention, by varying the phase relationship between the two input light sources that are combined, it is possible to vary and to control which of the perpendicular directions the photoelectron wave will take. It is actually the interference of the two electron waves that determines the direction. This interference is controlled by varying the phase relationship of the input light signals. In effect the probability of the wave function of photoelectrons is changed. Others, such as Fujii mentioned heretofore in U.S. Pat. No. 5,157,467, control the direction of electrons by physically interfering electrons produced in two separate waveguides.

Referring now to the present invention, in FIG. 3, a hybrid TEA $CO_2$ laser 300 is used in an experimental setup as a source of optical radiation. The experimental setup is a means for providing two harmonically related optical signals including means for controlling the amplitude and phase relationship between the two signals. The laser 300 is operated on the P20 transition at 10.6 microns and the output is monitored by splitting a small portion of its beam by reflecting it from an NaCl window 310 and directing the reflected portion of the beam to a photon drag detector 312. The 10.6 micron beam passes through a $CaF_2$ attenuator 314 into an AgGaSe non-linear crystal 316 to produce a beam of second harmonic light with a well defined phase relationship between the 10.6 micron beam and the 5.3 micron beam. A rotatable one inch thick NaCl window 320 is provided for altering the phase relation between the beams. By rotating the NaCl window 320, its optical thickness changes. A difference in dispersion between the 10.6 micron and 5.3 micron beams ensures that the phase relationship changes with angle. The NaCl window 320 is double passed to ensure that the beams do not become mis-aligned as the window is rotated. The relative intensity of the two beams is adjusted by passing them through a second $CaF_2$ attenuator 322 which mainly attenuates the 10.6 micron beam and then through a gas cell 324 containing a mixture of $SF_6$ gas and helium buffer gas. The cell is used as a variable attenuator for the 10.6 micron light. The pressure in the $SF_6$ cell is established by observing the signal on the weakly biased quantum well detector 330 with each beam independently so that they give substantially the same signal. The quantum well detector is oriented so that the quantum wells are sensitive to both beams. As is shown in FIG. 3, both beams have a component of the laser field in the direction $\phi=0$. The beams are then focused by lenses 328 on the quantum well sample 330 where the signal is observed as a function of the angle of the NaCl window 320. The circuit used for the measurements includes a variable voltage source (that is required if the sample is photovoltaic and not required if the quantum webs have no built in internal fields), an amplifier 340 to amplify the coherently induced signal, and means for registering the signal, such as an oscilloscope or a box car detector 342. FIG. 4 shows a quantum well structure mesa having embedded wells. Photoelectrons are produced by that component of the laser electric field in the direction $\phi=0$. Signal leads 410 carry the output to an amplifier and then to an oscilloscope or to the box car detector (not shown).

The sample used in this particular experimental arrangement is comprised of a stack of 32 quantum wells typically used as an infrared detector for 8 micron radiation; that is, its characteristics have been optimized for use as an infrared detector with peak detection in the 8 micron region. Growth technology is relatively well developed for such samples. The stack includes electrical connection leads for monitoring a current induced by irradiating the sample with the two optical signals. Alternatively, the sample could be a material such as a semiconductor absent of quantum wells. In this case, electrons can be produced by ionizing atoms in the semiconductor.

Alternative detection is also possible. The electrons could be directed to a portion of the material in which another device was grown and the electrons could trigger a response in this device. A wide range of applications follow from this configuration in which coherent control is used to switch other devices. A simple example which could be used for detection of current, or for applications of coherent control, would be to place a different impurity on each side of the quantum well device and then to observe a change in the florescence of the impurity as the electrons changed directions under the influence of the relative phase of the light beams.

The direction of the photoelectron current induced in the sample can be varied by varying the relative phase relationship between the two optical signals. As the phase relationship between the input optical signals is varied, the direction of the photoelectron current is also varied. By combining the two optical signals, and varying the phase relationship in a controlled manner, the induced photoelectron waves interfere so that their direction can be controlled.

Referring now to FIG. 5, the graph illustrates control over the current in the semiconductor sample when illuminated by the 10.6 micron and the 5.3 micron light simultaneously.

Figure 8A:
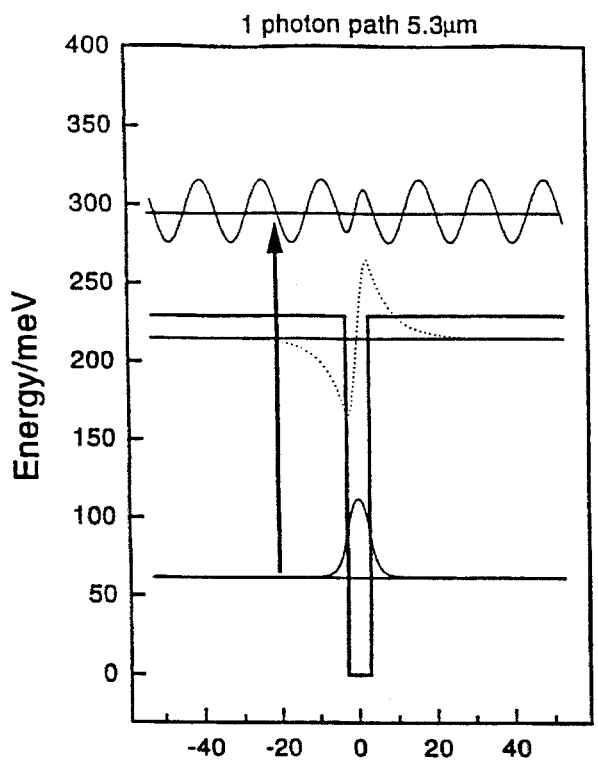
Figure 8B:
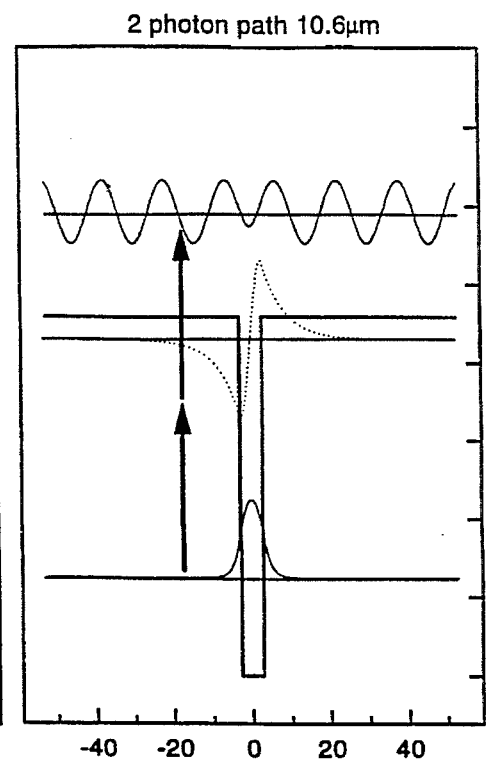
Figure 8C:
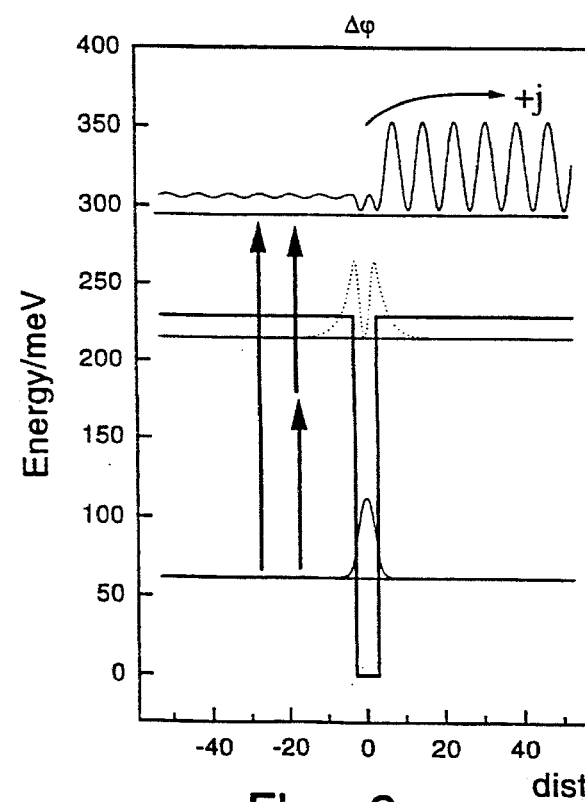
Figure 8D:
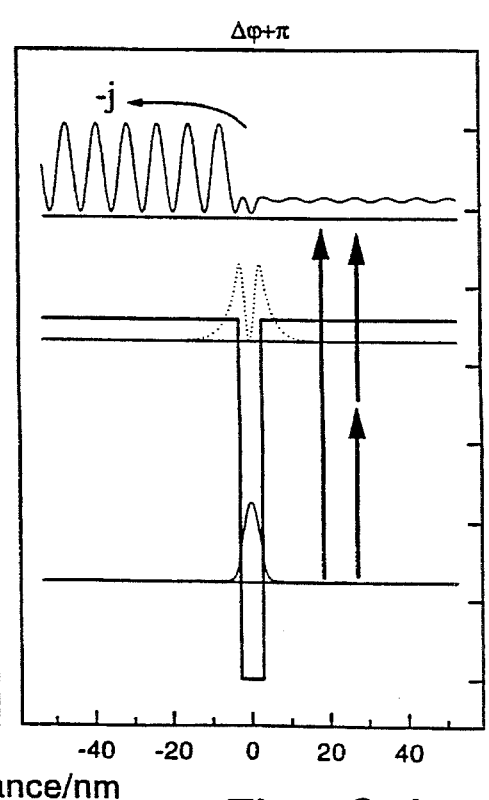

Plotted on the ordinate is a measure of the current that flows in the circuit as measured by a box car integrator as a function of the phase difference between the 10.6 and the 5.3 micron light. Current flow in both the positive and the negative direction are shown. The results are for a detector which was grown with no internal fields. If the sample was grown without care to remove internal fields, it is likely that there would be net current in one direction. This is known as a photovoltaic response. The output of a photovoltaic detector, when it is illuminated so as to observe coherent control is shown in FIG. 6. However, FIG. 7 shows that complete control can be observed of the direction of the photocurrent in a strongly photovoltaic detector if an external bias is used to cancel the photovoltaic response. The physical principle of coherent control of photocurrent in quantum well structures is illustrated in FIGS. 8a, 8b, 8c, and 8d. To illustrate the physical principles, we assume no dephasing of the electron and also that there is a single well. FIG. 8a shows the wavefront produced by a one photon transition into the continuum as it would appear at some moment in time. It is antisymmetric about the x=0 position of the quantum well. FIG. 8b shows the wavefunction produced by a two photon transition as it would look at some instant of time. It is symmetric about the x=0 position of the quantum well. Although the wave functions remain antisymmetric and symmetric respectively, the relative phase of both wave functions is determined by the relative phase of the optical beams. Referring now to FIGS. 8c and 8d respectively, assuming that the quantum well device is illuminated as described heretofore, then there will be some relative phase at which the wave functions will cancel on the left half space, implying that current flow is in the positive x direction. By modifying the relative phase of the two beams, the cancellation moves to the other half space, corresponding to current in the negative direction.

Of course, numerous other embodiments of the invention may be envisaged without departing from the spirit and scope of the invention.

What we claim is:

1. A method of a propagating photoelectrons in a semiconductor material in a predetermined direction, comprising the step of:

irradiating a selected region of the semiconductor material with two beams that overlap in space and time, the two beams having a predetermined phase relationship and being harmonically related such that the frequency of one is approximately a multiple of two of the other, and wherein each of the beams of light produce substantially the same number of photoelectrons in the semiconductor material.

2. The method as defined in claim 1, further comprising the step of varying the phase relationship between the two beams to change the direction of propagation of the photoelectrons.

3. A method of controlling a direction of photoelectrons in a semiconductor material comprising the steps of:

a) providing two harmonically related beams of light that overlap in space and time, each of the beams having a predetermined frequency;

b) adjusting the phase of the two beams of light so that the beams are in a predetermined phase relationship; and, c) irradiating a selected region of the semiconductor material with the two beams of light, the harmonic relationship between the beams of light being approximately a multiple of two, each of the beams having an amplitude that will producing substantially the same number of photoelectrons in the material.

4. An apparatus of controlling a direction of phototelectrons in a semiconductor material comprising:

means for providing two beams of light to propagate toward the semiconductor material, the beams being of an amplitude such that they produce substantially the same number of photoelectrons within the semiconductor material, the beams of light being related in frequency such that the frequency of one is approximately a multiple of two of the other; and means for varying the phase relationship between the two beams of light so that the beams are in a particular phase relationship when they enter the semiconductor material.

5. An apparatus of controlling a direction of phototelectrons in a semiconductor material as defined in claim 4, wherein the means for varying the phase relationship is for varying the beams in a predetermined phase relationship when they enter the semiconductor material.

* * * * *